US009583206B2

(12) United States Patent
Luo et al.

(10) Patent No.: US 9,583,206 B2
(45) Date of Patent: Feb. 28, 2017

(54) DATA STORAGE DEVICE HAVING REFLOW AWARENESS

(71) Applicant: SANDISK TECHNOLOGIES INC., Plano, TX (US)

(72) Inventors: Ting Luo, Sunnyvale, CA (US); Jianmin Huang, San Carlos, CA (US); Changyuan Chen, San Ramon, CA (US); Guirong Liang, Santa Clara, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 327 days.

(21) Appl. No.: 14/505,034

(22) Filed: Oct. 2, 2014

(65) Prior Publication Data

US 2016/0099078 A1  Apr. 7, 2016

(51) Int. Cl.
| | |
|---|---|
| G11C 16/34 | (2006.01) |
| G11C 29/46 | (2006.01) |
| G11C 29/02 | (2006.01) |
| G11C 7/20 | (2006.01) |
| G11C 29/04 | (2006.01) |

(52) U.S. Cl.
CPC ............. *G11C 16/349* (2013.01); *G11C 7/20* (2013.01); *G11C 29/025* (2013.01); *G11C 29/46* (2013.01); *G06F 2201/81* (2013.01); *G11C 2029/0407* (2013.01)

(58) Field of Classification Search
None
See application file for complete search history.

(56) References Cited

U.S. PATENT DOCUMENTS

| | | |
|---|---|---|
| 8,001,441 B2 | 8/2011 | Brandman |
| 8,458,563 B2 | 6/2013 | Sharon et al. |
| 8,484,542 B2 | 7/2013 | d'Abreu et al. |
| 8,711,619 B2 | 4/2014 | Patapoutian et al. |
| 8,806,297 B2 | 8/2014 | d'Abreu et al. |
| 9,146,814 B1* | 9/2015 | van der Merwe .. G06F 11/3031 |
| 2005/0083726 A1 | 4/2005 | Auclair et al. |
| 2006/0221741 A1* | 10/2006 | Jain ..................... G01K 7/425 |
| | | 365/211 |
| 2010/0169547 A1* | 7/2010 | Ou ....................... G06F 12/0246 |
| | | 711/103 |

(Continued)

OTHER PUBLICATIONS

Cai et al., "Error Patterns in MLC NAND Flash Memory: Measurement, Characterization, and Analysis", IEEE Design, Automation & Test in Europe Conference & Exhibition, Mar. 2012, 6 pages.

(Continued)

*Primary Examiner* — Steve Nguyen
(74) *Attorney, Agent, or Firm* — Toler Law Group, PC

(57) ABSTRACT

A method includes, responsive to a power-up event at a data storage device that includes a memory, reading a flag stored at the data storage device and determining that the flag has a first value indicating that a reflow operation has not previously been detected at the memory. The method also includes, in response to determining that the flag has the first value, performing reflow detection at the memory. The method further includes, in response to the reflow detection indicating that the reflow operation has occurred, setting the flag to a second value.

20 Claims, 4 Drawing Sheets

(56) References Cited

U.S. PATENT DOCUMENTS

| | | | |
|---|---|---|---|
| 2011/0075482 A1* | 3/2011 | Shepard | G11C 11/5621 365/185.11 |
| 2011/0107049 A1* | 5/2011 | Kwon | G06F 11/004 711/165 |
| 2011/0199823 A1* | 8/2011 | Bar-or | G11C 11/5628 365/185.03 |
| 2012/0268995 A1* | 10/2012 | Sugimoto | G11C 16/349 365/185.11 |
| 2013/0308390 A1* | 11/2013 | Lee | G11C 16/3481 365/185.22 |
| 2014/0281750 A1 | 9/2014 | Jeon et al. | |
| 2014/0281772 A1 | 9/2014 | Jeon et al. | |

OTHER PUBLICATIONS

Jung et al., "Modeling of Vth Shift in NAND Flash-Memory Cell Device Considering Crosstalk and Short-Channel Effects", IEEE Transactions on Electron Devices, vol. 55, No. 4, Apr. 2008, pp. 1020-1026.

Zhou et al., "Error-Correcting Schemes with Dynamic Thresholds in Nonvolatile Memories", IEEE International Symposium on Information Theory Proceedings, Jul. 2011, pp. 2143-2147.

Mekhanik, Evgeny et al. "Block Closure Techniques for a Data Storage Device," U.S. Appl. No. 14/080,626, filed Nov. 14, 2013, 38 pages.

Mekhanik, Evgeny et al. "Data Retention Detection Techniques for a Data Storage Device," U.S. Appl. No. 14/080,655, filed Nov. 14, 2013, 40 pages.

Mekhanik, Evgeny et al. "Block Closure Techniques for a Data Storage Device," U.S. Appl. No. 14/286,501, filed May 23, 2014, 38 pages.

* cited by examiner

DATA STORAGE DEVICE HAVING REFLOW AWARENESS

FIELD OF THE DISCLOSURE

The present disclosure is generally related to determining whether a reflow operation has occurred.

BACKGROUND

Non-volatile data storage devices have enabled increased portability of data and software applications. As research and development in the field of data storage devices progresses, data storage devices are able to store increasingly larger amounts of data. A data storage device may be used as "embedded" memory of a portable computing device (e.g., mobile phone). The data storage device may be mounted to a circuit board of the portable computing device using reflow soldering. Prior to the reflow soldering, certain data may have been stored in the data storage device using a preloading process. In some situations, one or more blocks within the data storage device may be partially written (e.g., because the total amount of data written to the data storage device is not divisible by the block size of the data storage device). The partially written block(s) may include programmed word lines as well as unprogrammed word lines. Due to effects of heating caused by the reflow process, the unprogrammed word lines may exhibit poor data retention and threshold voltage shifting, as compared to other word lines. Thus, certain portions of the data storage device may have lower reliability than other portions of the data storage device.

SUMMARY

To determine whether a data storage device has undergone a reflow operation, a host device connected to the data storage device may operate in a production awareness mode. In the production awareness mode, the host device may notify the data storage device at the start of the preloading process to store data in the data storage device. The host device may also notify the data storage device when the preloading process is completed. The host device may further notify the data storage device after a reflow operation has occurred. However, some host devices may not support a production awareness mode. When a data storage device is embedded in a host device that does not support a production awareness mode, the data storage device may be unable to identify word lines that have poor data retention and threshold voltage shifting due to a reflow operation.

The present disclosure provides reflow awareness in a data storage device. For example, in accordance with systems and methods described herein, a data storage device may be enabled to determine whether a reflow operation has occurred without relying on notifications from a host device. The data storage device may store a flag indicating whether the data storage device has undergone a reflow operation. For example, the flag may be stored in a non-volatile memory of the data storage device that is accessed by firmware during an initialization process (e.g., power-up initialization) of the data storage device. The firmware may "tag" word lines of the data storage device that were unprogrammed at the start of the reflow operation. The data storage device may restrict tagged word lines to storing single-level cell (SLC) data but not multi-level cell (MLC) data, because read margins for MLC data may be smaller than read margins for SLC data.

In response to initialization (e.g., a power-up event) at the data storage device, the flag may be read by the firmware. If a reflow operation (e.g., an infrared (IR) reflow operation) has not previously been detected, the flag has a first value (e.g., flag=1). If a reflow operation has previously been detected, the flag has a second value (e.g., flag=0). When the flag has the second value, reflow detection operations may be skipped to shorten memory initialization time and to save power. Conversely, if the flag has the first value, the memory may perform reflow detection to determine whether a reflow operation has occurred since the last time the flag was written. For example, an error metric, such as failure bit count (FBC), may be determined and compared to a threshold. The error metric may be determined for one or more word lines of the memory, one or more blocks of the memory, or the entire memory. If the error metric satisfies (e.g., is greater than) the threshold, the memory may determine that a reflow operation occurred, and the flag may be set to the second value so that the reflow detection operations are skipped during subsequent initializations. Further, when the error metric satisfies the threshold, unprogrammed word lines of the memory may be tagged as being unsuitable for MLC data storage.

DETAILED DESCRIPTION

Particular embodiments of the present disclosure are described with reference to the drawings. In the description, common features are designated by common reference numbers throughout the drawings.

Figure 1:
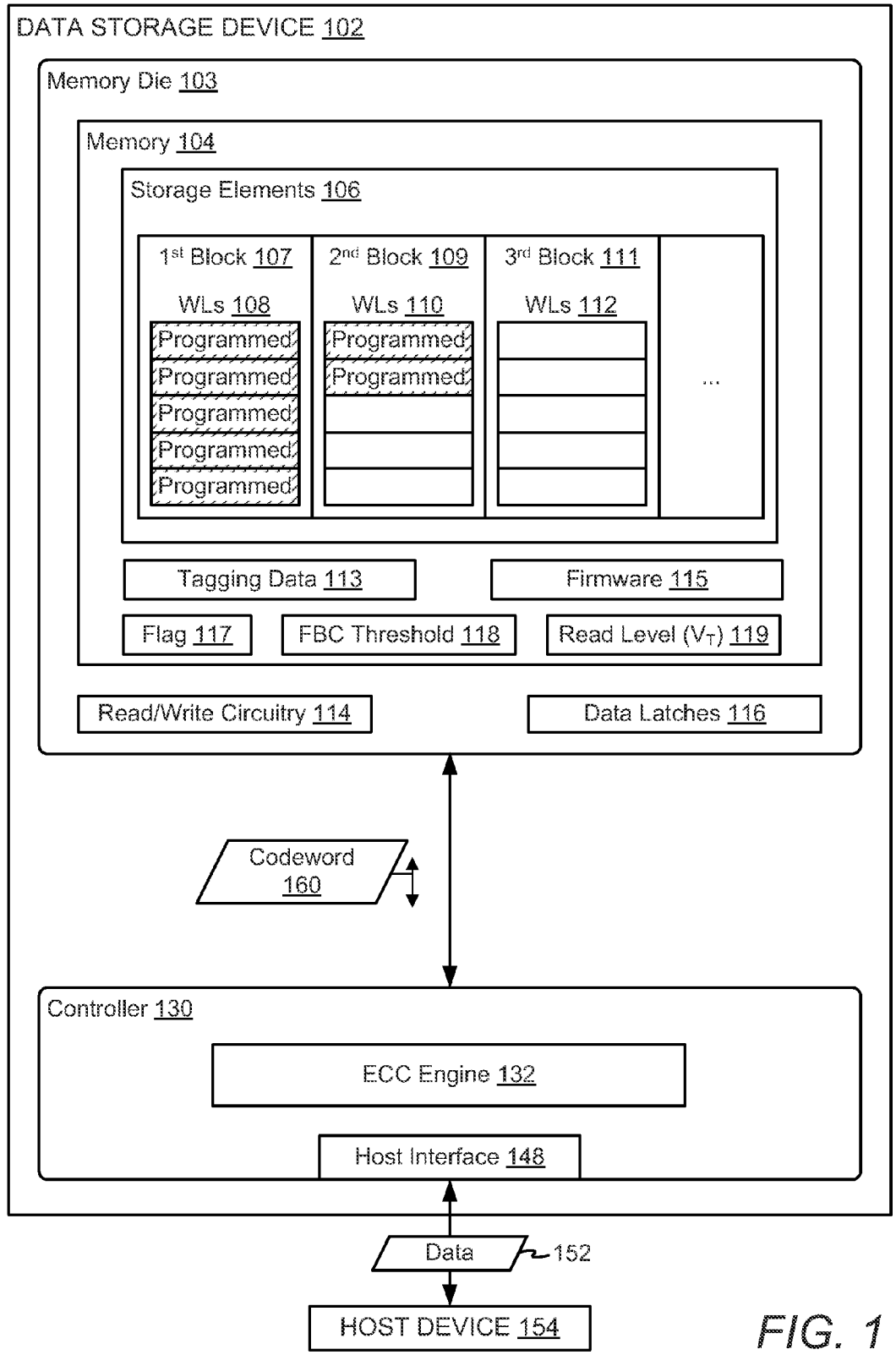
FIG. 1 is a block diagram of a first illustrative embodiment of a system that includes a data storage device having reflow awareness.

Referring to FIG. 1, an illustrative example of a system is depicted and generally designated 100. The system 100 includes a data storage device 102 and a host device 154. The data storage device 102 and the host device 154 may be operationally coupled via a connection, such as a bus or a wireless connection. The data storage device 102 may be embedded within the host device 154, such as in accordance with a Joint Electron Devices Engineering Council (JEDEC) Solid State Technology Association Universal Flash Storage (UFS) configuration. Alternatively, the data storage device 102 may be removable from the host device 154 (i.e., "removably" coupled to the host device 154). As an example, the data storage device 102 may be removably coupled to the host device 154 in accordance with a removable universal serial bus (USB) configuration.

The data storage device 102 includes a memory die 103 and a controller 130. The memory die 103 and the controller 130 may be coupled via one or more buses, one or more interfaces, and/or another structure. An interface may be wired (e.g., a bus structure) or wireless (e.g., a wireless communication interface).

The memory die 103 includes a memory 104 (e.g., a non-volatile memory), read/write circuitry 114, and data latches 116. The memory 104 may include non-volatile memory, such as flash memory (e.g., NOR flash or NAND flash), resistive random access memory (ReRAM), magnetic random access memory (MRAM), and/or another type of memory. In a particular embodiment, the memory 104 has a three-dimensional (3D) memory configuration, such as a vertical bit line (VBL) 3D architecture. To illustrate, the memory 104 may be a non-volatile memory having a 3D memory configuration that is monolithically formed in one or more physical levels of arrays of memory cells having an active area disposed above a silicon substrate, and the memory die 103 may include circuitry associated with operation of the memory cells (e.g., including but not limited to the read/write circuitry 114 and the data latches 116). Alternatively, the memory 104 may have another configuration, such as a two-dimensional (2D) memory configuration or a stacked 2D memory configuration.

The memory 104 may include storage elements 106 (e.g., memory cells), which may be connected via bit lines and word lines. The memory 104 may be divided into different logical and/or physical sections, such as error correction coding (ECC) pages, erase blocks, etc. Each such section may include multiple word lines. In the example of FIG. 1, the memory 104 includes a first block 107 having word lines 108, a second block 109 having word lines 110, and a third block 111 having word lines 112. Each word line may include or may be connected to multiple storage elements (e.g., cells). Each such storage element may store one or more bit values. For example, when a storage element is used to store a single bit value (e.g., SLC data), the single bit value may be determined by comparing a resistance of the storage element to a threshold. As another example, when a storage element is used to store multiple bit values (e.g., MLC data), the multiple bit values may be determined by comparing a resistance of the storage element to multiple thresholds.

As illustrated, different portions of the memory 104 may store different data. Certain data may be preloaded into the memory 104 before a reflow operation or process (e.g., infrared (IR) reflow soldering) is used to mount the memory die 103 onto another device. For example, a device manufacturer may store the preloaded data into the memory 104 and the data storage device 102 may be assembled later in a process that includes electrically coupling the memory die 103 to the controller 130, such as by mechanically mounting the memory die 103 onto a printed circuit board (PCB) using an IR reflow operation, where the controller 130 (e.g., a die including the controller) is also mechanically mounted onto the same PCB.

In the example of FIG. 1, the preloaded data occupies all of the word lines 108 of the first block 107. The first block 107 may be considered a "closed" block, because each word line 108 of the first block 107 is in a programmed state (shown in FIG. 1 using shading) and stores MLC data or SLC data when the reflow operation occurs. In a particular embodiment, an "open" block is a block that includes at least one word line storing MLC data and at least word line that is unprogrammed when a reflow operation occurs. Thus, the second block 109 may be considered an open block. Alternatively, a block including at least one unprogrammed word line may be considered an open block independent of whether another word line of the block is programmed. In this alternative embodiment, both the second block 109 and the third block 111 may be considered open blocks. Open blocks may be caused by a preloading operation when an amount of data (e.g., MLC data) written during the preloading operation is not divisible by the block size of the memory 104.

The memory 104 may store a flag 117 indicating whether a reflow operation has previously been detected at the memory 104. The flag 117 may correspond to single-bit data or multi-bit data. A first value of the flag (e.g., flag=1) may indicate that a reflow operation has not previously been detected, and a second value of the flag (e.g., flag=0) may indicate that a reflow operation has previously been detected. The flag 117 may initially be set to the first value, such as when the memory 104 is manufactured or when the firmware 115 is initially downloaded/stored. The flag 117 may be read and/or written during an initialization process (e.g., responsive to a power-up event) performed by firmware 115 of the memory 104, as further described herein. It should be noted that as used herein, the memory 104 "detecting" or "determining" a reflow operation is not to be limited to the memory detecting or determining the actual reflow operation (e.g., at the start of, during, or at the end of the actual reflow operation). Detecting or determining that a reflow operation has occurred may include inferring that the reflow operation has occurred based on an error metric, as further described with reference to FIGS. 2-4.

The controller 130 may include an error correcting code (ECC) engine 132 and a host interface 148. The ECC engine 132 is configured to receive data and to generate one or more ECC codewords based on the data. The ECC engine 132 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof. The ECC engine 132 is also configured to perform error correction with respect to data read from the memory 104. For example, the ECC engine 132 may be configured to decode data accessed from the memory 104 to detect and correct one or more bit errors that may be present in the data, up to an error correcting capacity of the ECC engine 132.

The controller 130 is configured to receive data and instructions from the host device 154 and to send data to the host device 154. For example, the controller 130 may receive data from the host device 154 via the host interface 148 and may send data to the host device 154 via the host interface 148. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 is configured to send a read command to the memory 104 to access data from a specified address of the memory 104. The read command may specify the physical address of a portion of the memory 104 (e.g., a physical address of a word line of the memory 104).

The host device 154 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 154 may communicate via a host controller, which may enable the host device 154 to communicate with the data storage device 102. The host device 154 may operate in compliance with a JEDEC Solid State Technology Association industry specification, such as an embedded MultiMedia Card (eMMC) specification or a Universal Flash Storage (UFS) Host Controller Interface specification. The host device 154 may operate in compliance with one or more other specifications, such as a Secure Digital (SD) Host Controller specification as an illustrative example. Alternatively, the host device 154 may communicate with the data storage device 102 in accordance with another communication protocol.

The memory 104 may undergo read and/or write operations before reflow as well as after reflow. When initialization (e.g., a power-up event) is detected, the firmware 115 at the memory 104 may be executed to perform an initialization procedure. For example, the firmware 115 (or a portion thereof) may be copied into a random access memory (RAM) of the controller 130 and executed by the controller 130. As another example, the firmware 115 may be executed by a processor or other device on the memory die 103. An initialization procedure for the memory 104 may be performed with reflow detection enabled or disabled. To illustrate, in response to a power-up event, the value of the flag 117 may be read. When the flag 117 indicates that a reflow operation has not previously been detected (e.g., flag=0), reflow detection may be performed at the memory 104 to determine whether a reflow operation occurred since the last time the flag 117 was written. When the flag 117 indicates that a reflow operation has previously occurred and been detected (e.g., flag=1), reflow detection may be skipped to shorten a memory initialization time period and to reduce power consumption during memory initialization.

In a particular embodiment, performing reflow detection includes determining an error metric and comparing the error metric to a threshold. To illustrate, the memory 104 may store a failure bit count (FBC) threshold 118 and/or a read level (e.g., a threshold voltage ($V_T$)) 119. The FBC threshold 118 and the read level 119 may be determined and stored at the memory 104 during manufacture, may be modified during operation of the data storage device 102 (e.g., via firmware download), or both. To perform reflow detection, multiple read operations may be performed at the memory 104. The read operations may be performed on closed blocks, open blocks, programmed word lines, unprogrammed word lines, or any combination thereof. Reflow detection may include performing read operations on the entire memory or a portion of the memory. If multiple blocks or word lines are read, an average error metric may be determined and compared to the threshold.

Figure 2:
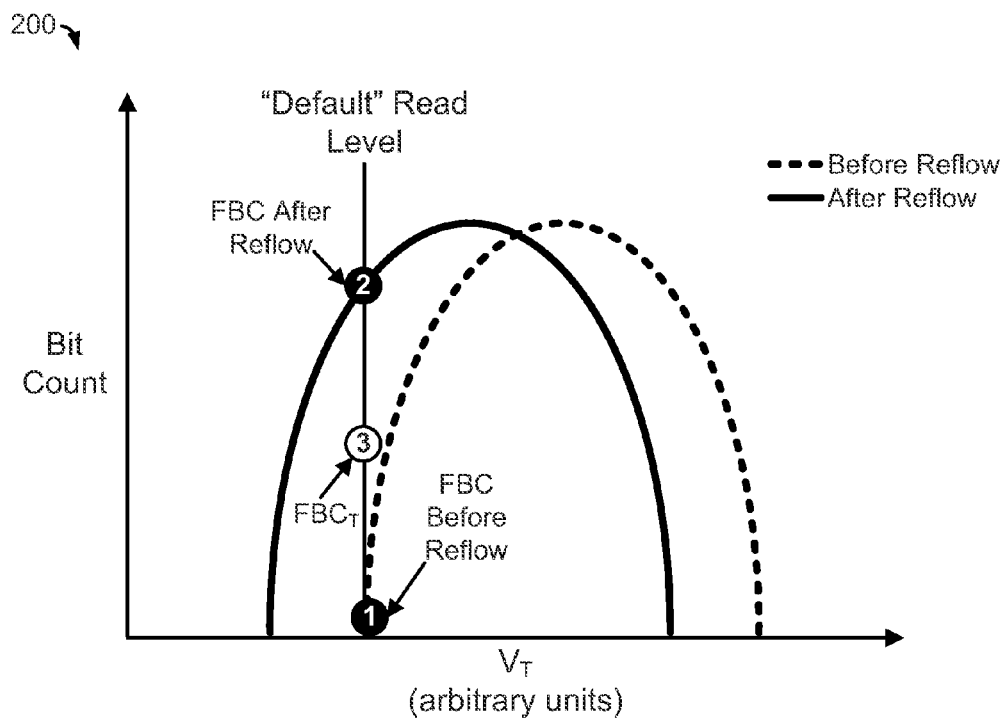
FIG. 2 illustrates a first method of performing reflow detection.
Figure 3:
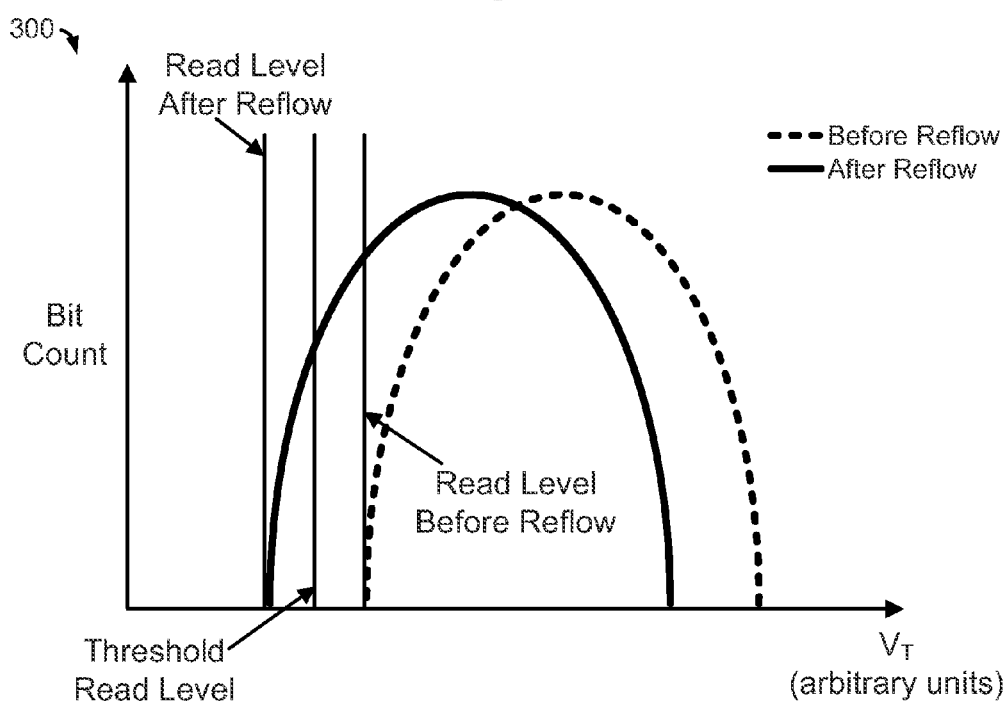
FIG. 3 illustrates a second method of performing reflow detection.
Figure 4:
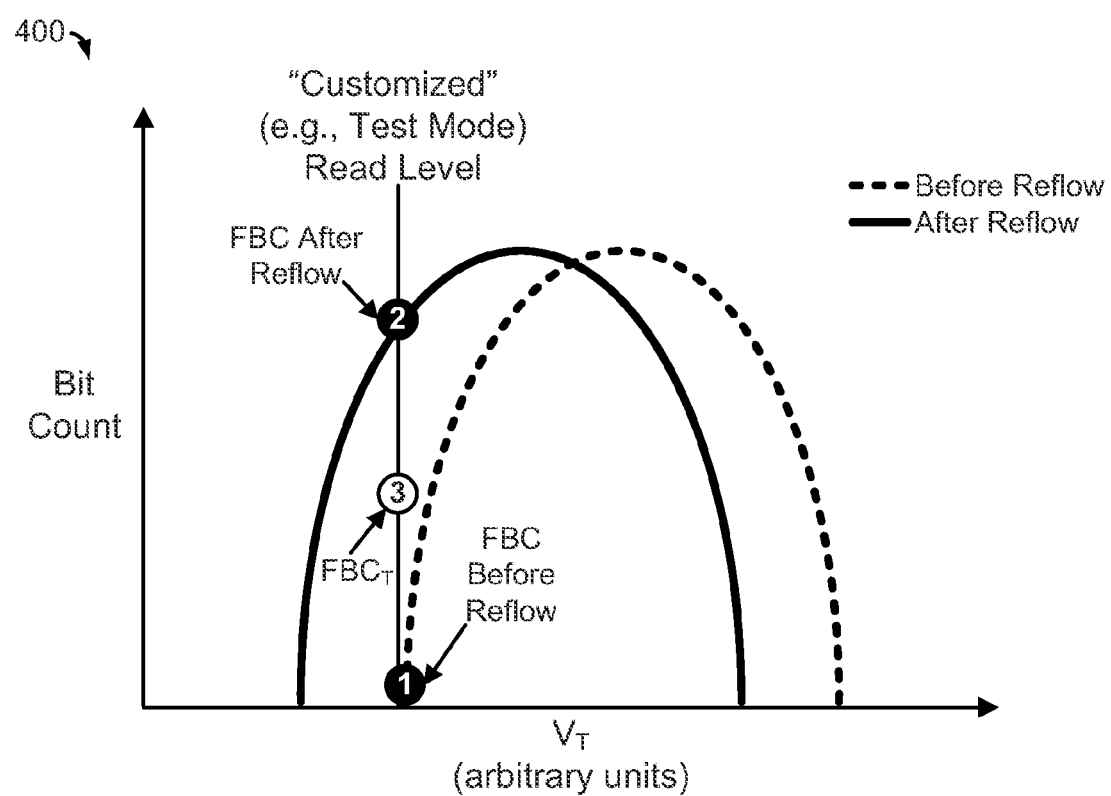
FIG. 4 illustrates a third method of performing reflow detection.

The memory 104 may be configured to perform one or more methods of reflow detection. A first method of reflow detection is illustrated in FIG. 2 and generally designated 200. In the first method, the read level 119 corresponds to a "default" (e.g., manufacturer-set) read level of the memory 104, and the FBC threshold 118 is determined as follows. FIGS. 2-4 illustrate voltage curves (e.g., "lobes") corresponding to the memory 104 before reflow (dashed line) and after reflow (solid line) for a particular storage state. For example, a storage element of the memory may have multiple storage states, each storage state indicating a different combination of one or more bit values stored in the storage element. When a storage element stores a single bit value, the storage element may be in an "ERASE" state corresponding to a first stored value (e.g., 1) or an "A" state corresponding to a second logical value (e.g., 0). As another example, if a storage element stores two bits, the storage element may have four possible resistance states: ERASE (corresponding to 00), A (corresponding to 01), B (corresponding to 10), and C (corresponding to 11). Thus, although FIGS. 2-4 illustrate voltage distribution curves for SLC data, it should be understood that voltage distribution curves for MLC data may be also be determined and used.

As shown in FIGS. 2-4, the voltage distribution curve of a memory shifts to the left after reflow (i.e., average read threshold voltage decreases). As a result, a post-reflow FBC (designated "2" in FIG. 2) at a particular read level is less than a pre-reflow FBC (designated "1" in FIG. 2). The manufacturer may measure FBC before and after reflow for one or more sample memories to determine a value of the FBC threshold 118 (designated "$FBC_T$" in FIG. 2). As shown in FIG. 2, $FBC_T$ may be between the pre-reflow FBC and the post-reflow FBC. To perform reflow detection, the memory 104 may determine a FBC value and may compare the FBC value to the FBC threshold 118. If the FBC value satisfies (e.g., exceeds) the FBC threshold 118, the memory 104 may determine that a reflow operation occurred prior to the memory 104 being powered on. In response to the determination that a reflow operation has occurred, the flag 117 may be set to the second value (e.g., flag=0). Alternatively, the value of the flag 117 may be left unchanged if the reflow detection process indicates that a reflow operation has not occurred.

A second method of reflow detection is illustrated in FIG. 3 and generally designated 300. In the second method, the FBC threshold 118 corresponds to a "target" or "minimum" FBC, and the read level 119 is determined as follows. A manufacturer may measure pre-reflow FBC for one or more sample memories using multiple values of $V_T$, and may determine a "read level before reflow" as a pre-reflow $V_T$ value that resulted in the pre-reflow FBC being less than or equal to the FBC threshold 118. Similarly, a "read level after reflow" may be determined as a post-reflow $V_T$ value that resulted in the post-reflow FBC being less than or equal to the FBC threshold 118. The manufacturer may determine the read level 119 based on the pre-reflow $V_T$ and the post-reflow $V_T$. As shown in FIG. 3, the read level 119 may be between the pre-reflow $V_T$ and the post-reflow $V_T$. To perform reflow detection, the memory 104 may determine a FBC value by performing read operations using the read level 119 and may compare the FBC value to the FBC threshold 118. If the FBC value satisfies (e.g., exceeds) the FBC threshold 118, the memory 104 may determine that a reflow operation occurred prior to the memory 104 being powered on. In response to the determination that a reflow operation occurred, the flag 117 may be set to the second value (e.g., flag=0). Alternatively, the value of the flag 117 may be left unchanged if the reflow detection process indicates that a reflow operation has not occurred.

A third method of reflow detection is illustrated in FIG. 4 and generally designated 400. Whereas the first method illustrated in FIG. 2 uses a "default" read level, in the third method the read level 119 corresponds to a "customized" (e.g., test mode) read level. For example, a manufacturer may determine the "customized" read level based on device characteristics (e.g., physical characteristics and/or characteristics that are measured during operation of one or more sample memories, such as in test mode). Examples of device characteristics include, but are not limited to, bit error rate, write/erase cycle count, memory size, memory configuration, etc. The FBC threshold 118 (designated "$FBC_T$" in FIG. 4) may have a value that is between the pre-reflow FBC and the post-reflow FBC, which may be measured using the "customized" read level. To perform reflow detection, the memory 104 may determine a FBC value and may compare the FBC value to the FBC threshold 118. If the FBC value satisfies (e.g., exceeds) the FBC threshold 118, the memory 104 determines that a reflow operation occurred prior to the memory 104 being powered on. In response to the determination that a reflow operation occurred, the flag 117 may be set to the second value (e.g., flag=0). Alternatively, the value of the flag 117 may be left unchanged if the reflow detection process indicates that a reflow operation has not occurred.

In a particular embodiment, performing reflow detection includes performing a cell voltage distribution (CVD) process that includes sensing a group of storage elements at multiple read levels (e.g., voltages) to obtain a mapping or histogram of cell threshold voltage distributions. For example, a CVD process may be used by a manufacturer and/or during operation of the data storage device 102 to obtain the voltage distribution curves of FIGS. 2-4, the FBC threshold 118, and/or the read level 119. An analysis may be performed to detect one or more minima and to select one or more read threshold voltages that result in a reduced or minimal number of errors when data is read from the group of storage elements. In a particular embodiment, a dynamic read process may be used instead of or in addition to a CVD process. For example, the dynamic read process may determine a read level by iteratively adjusting an offset applied to the read level until one or more minima in a number of errors in resulting read data are detected.

After a reflow operation has been detected and the flag 117 has been set to the second value (e.g., flag=0), when the initialization procedure is performed again (e.g., responsive to another power-up event), the memory 104 may skip performing reflow detection based on the flag 117 having the second value. Thus, the flag 117 may be used to restrict the memory 104 from performing reflow detection more than once, which may shorten a time period and energy consumption of the power-up initialization process. Further, because a reflow operation may occur at the beginning of a life cycle of the memory 104, the flag 117 may prevent reflow detection due to a threshold voltage shift that may occur near the end of the life cycle of the memory 104 due to memory wear.

The memory 104 may perform additional operations in response to determining that a reflow operation has occurred. For example, the memory 104 may identify unprogrammed word line(s) of open blocks the memory 104. Such unprogrammed word lines may exhibit poor data retention and threshold voltage shifting as compared to other word lines. The memory 104 may store "tagging" data 113 that identifies such word line(s). Thus, in the example of FIG. 1, the tagging data 113 may identify a subset of the word lines 110 of the second block 109 and all of the word lines 112 of the third block 111. In a particular embodiment, the tagging data 113 is used to restrict word line(s) from storing MLC data, as further described herein. Alternatively, the tagging data 113 may be used to indicate "bad" blocks that will not be used in the future (when a block is tagged as "bad," the preloaded data stored in the block may be copied to another block).

After power-up initialization, the memory 104 may be used for read and write operations. For example, the controller 130 may receive data 152 and a request for write access to the memory 104 from the host device 154 via the host interface 148. The data 152 may correspond to a data file (e.g., an image file, an audio file, or a video file, as illustrative examples). The controller 130 may provide the data 152 to the ECC engine 132 to generate one or more ECC codewords (e.g., an illustrative codeword 160) based on the data 152. The controller 130 may initiate one or more operations to write the one or more ECC codewords to the memory 104. For example, the controller 130 may write the one or more ECC codewords into the data latches 116 and send a write command to the memory die 103. The read/write circuitry 114 may retrieve the one or more ECC codewords from the data latches 116 and write the one or more ECC codewords into the memory 104.

In a particular embodiment, the read/write circuitry 114 may use the tagging data 113 to select word lines for writing data. To illustrate, in response to receiving data for storage at the memory 104, the read/write circuitry 114 may search a table or other data structure, which may include the tagging data 113, for available (e.g., unallocated) storage elements of the memory 104. If data is provided for MLC storage, the read/write circuitry 114 may select word lines other than the word lines identified by the tagging data 113. As another example, if the data is provided for SLC storage, the read/write circuitry 114 may select a word line identified by the tagging data 113 or a word line that is not identified by the tagging data 113 (and is therefore permitted to store SLC data or MLC data).

In a particular embodiment, the tagging data 113, the flag 117, the FBC threshold 118, and the read level 119 are reserved for firmware usage (e.g., not permitted be read and/or written by the host device 154). In an example, the tagging data 113, the flag 117, the FBC threshold 118, and the read level 119 may be stored in a management data portion of the memory 104 along with logical/physical address tables and other management data.

The controller 130 may receive a request for read access to the memory 104 from the host device 154 via the host interface 148. The request may include an address of requested data, such as a word line address. The controller 130 may send a read command to the memory die 103, causing the read/write circuitry 114 to read the bit values stored in the addressed storage elements. Bit values may be read by comparing the bit values to a single threshold (e.g., for SLC data) or to multiple thresholds (e.g., for MLC data). The read/write circuitry 114 may provide an ECC codeword representation to the ECC engine 132. The ECC engine 132 may correct one or more bit errors in the ECC codeword representation and provide the error corrected data (e.g., the data 152) to the host device 154.

FIGS. 1-4 thus illustrate embodiments in which the memory 104 of the data storage device 102 has reflow awareness and does not have to rely on information from the host device 154 to determine whether a reflow operation has occurred. In addition, the reflow detection methods described with reference to FIGS. 1-4 can be incorporated into existing data storage devices by downloading new or modified firmware that includes, for example, an error metric threshold, a read level threshold, an ability to selectively enable or disable reflow detection based on a flag, and an ability to modify the value of the flag in response to detecting that a reflow operation has occurred. Thus, the described reflow detection methods may be preferable to methods that require the addition of special-purpose circuitry to the memory die 103.

Figure 5:
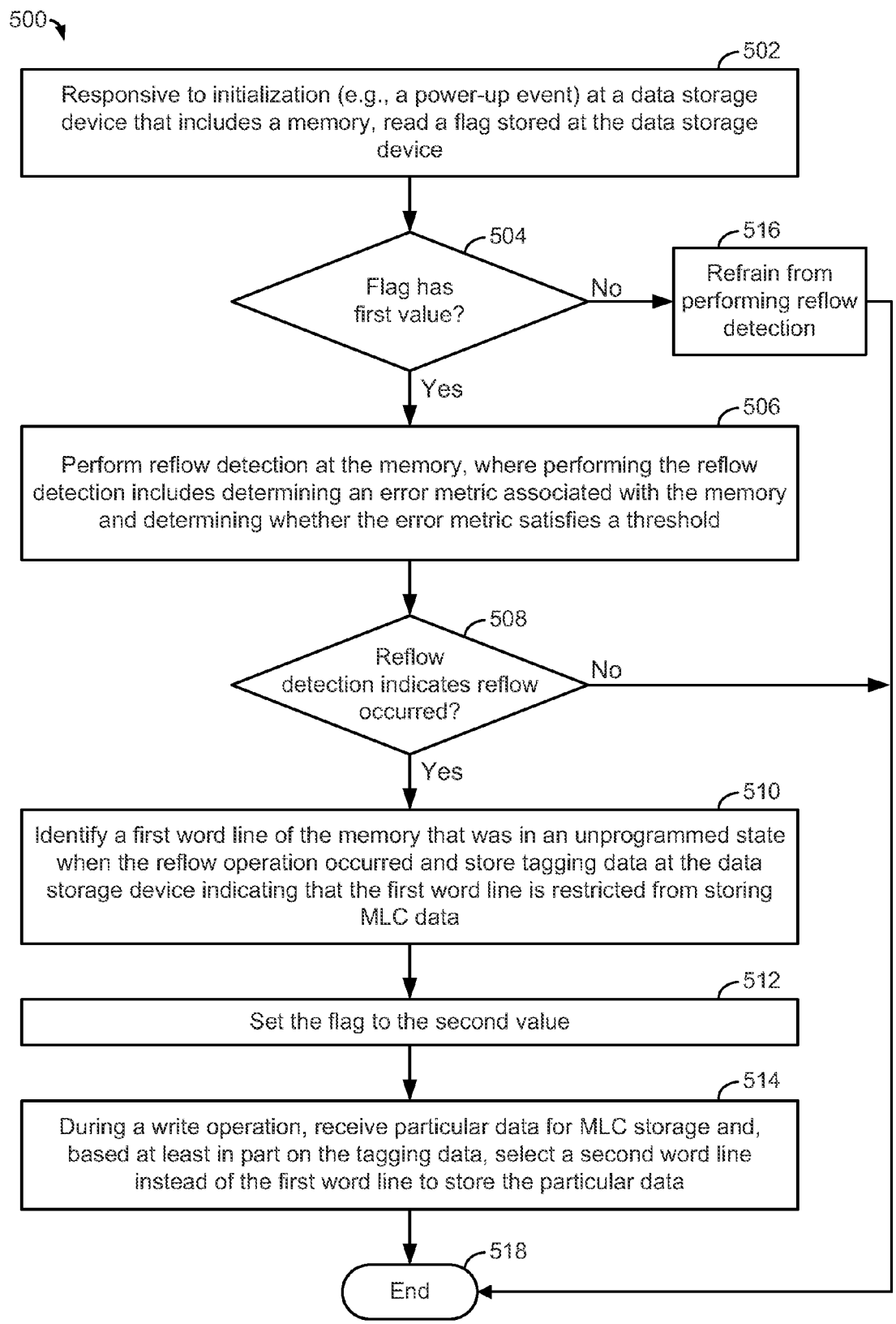
FIG. 5 is a flow diagram of an illustrative method of operation at the data storage device of FIG. 1.

Referring to FIG. 5, an illustrative embodiment of a method of operation at data storage device including a memory having reflow awareness is shown and generally designated 500. In an illustrative embodiment, the method 500 is performed at the data storage device 102 of FIG. 1, which includes the memory 104.

The method 500 may include, responsive to initialization (e.g., a power-up event) at the data storage device, reading a flag stored at the data storage device, at 502. For example, the value of the flag 117 may be read from a management data portion of non-volatile memory during an initialization process. The method 500 may also include determining whether the flag has a first value, at 504. When the flag does not have the first value (e.g., flag=0), the method 500 may refrain from performing reflow detection, at 516. For example, an initialization process may be performed at the memory 104 with reflow detection disabled (e.g., reflow detection operations may be skipped). The method 500 ends at 518.

When the flag has the first value (e.g., flag=1), the method 500 includes performing reflow detection at the memory, at 506. Performing the reflow detection may include determining an error metric associated with the memory (or a portion thereof) and determining whether the error metric satisfies a threshold. For example, the memory 104 may perform the first method of reflow detection described with reference to FIG. 2, the second method of reflow detection described with reference to FIG. 3, the third method of reflow detection described with reference to FIG. 4, a CVD process, a dynamic read process, or another reflow detection method.

The method 500 may further include determining whether the reflow detection indicates that a reflow operation occurred, at 508. For example, the memory 104 may determine that a reflow operation has occurred when the error metric (e.g., FBC) exceeds the threshold (e.g., the FBC threshold 118). As an example, the error metric (e.g., FBC) may be determined by performing multiple read operations using a particular read level (e.g., the read level 119).

When the reflow detection indicates that a reflow operation has not occurred, the method 500 ends, at 518. When the reflow detection indicates that a reflow operation has occurred, the method 500 may include identifying a first word line of the memory that was in an unprogrammed state when the reflow operation occurred, at 510. For example, it may be assumed that word lines that are unprogrammed at initialization/power-up were also unprogrammed when the reflow operation occurred, because reflow is detected on the first initialization/power-up after the reflow operation occurred (on subsequent initializations/power-ups, a modified value of the flag prevents reflow detection from being performed). Tagging data may be stored at the data storage device indicating that the first word line is restricted from storing MLC data. For example, the memory 104 may store the tagging data 113 identifying a subset of the word lines 110 of the second block 109 and/or all of the word lines 112 of the third block 111. The method 500 may also include setting the flag to the second value, at 512.

Continuing to 514, the method 500 may include, during a write operation, receiving particular data for MLC storage. Based at least in part on the tagging data, a second word line may be selected to store the particular data instead of the first word line. For example, the data storage device 102 may receive the data 152 from the host device 154, and the controller 130 may generate the ECC codeword 160 for MLC storage. The read/write circuitry 114 may store the ECC codeword 160 in word line(s) other than unprogrammed word lines of the second block 109 and/or the third block 111 that are identified by the tagging data 113. As another example, when data is received for SLC storage, the read/write circuitry 114 may select a word line identified by the tagging data. In an alternative embodiment, word lines identified by the tagging data may be considered "bad" word lines that are not used to store any kind of data. In yet another particular embodiment, the tagging data 113 may be used by the memory 104, the controller 130, and/or the host device 154 to determine a physical address to map to a requested logical address for storing data (e.g., when searching for available/unallocated storage elements). The method 500 may end, at 518.

The method of FIG. 5 may thus enable a data storage device to detect whether a reflow operation has occurred without relying on input from a host device. Thus, the method of FIG. 5 may enable the data storage device to identify word lines that have poor data retention and threshold voltage shifting due to a reflow operation, including when the data storage device is connected to a host device that does not support a production awareness mode. It should be noted that one or more operations of the method 500 may be performed in a different order and/or at least partially concurrently. For example, the operations at 510 and 512 may be performed in the opposite order or at least partially concurrently.

It should be noted in particular embodiments, one or more operations described as being performed at the memory die 103 may alternatively be performed at the controller 130, and vice versa. Further, data described as being stored at the memory die 103 (e.g., the firmware 115, the tagging data 113, the flag 117, the FBC threshold 118, and/or the read level 119) may alternatively be stored at the controller 130 and/or copied to the controller 130 during operation of the data storage device 102.

Although certain examples have been provided for illustration, it should be appreciated that certain modifications or substitutions may be made to such examples without departing from the disclosure. It is also noted that certain characteristics of the data storage device 102 may be modified (e.g., updated) using a firmware update or other update. For example, a firmware update may be used to add a reflow awareness capability to existing data storage devices. The firmware update may include an initial value for the flag 117, the FBC threshold 118, and/or the read level 119.

Although the controller 130 and certain other components described herein are illustrated as block components and described in general terms, such components may include one or more microprocessors, state machines, and/or other circuits configured to enable the data storage device 102 (or one or more components thereof) to perform operations described herein. One or more components described herein may be operationally coupled using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform operations described herein, such as one or more operations of the method 500 of FIG. 5. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

To further illustrate, the controller 130 may include a processor that is configured to execute instructions to perform certain operations described herein. For example, the processor may include one or more execution units that are operable to execute the instructions. The processor may execute the instructions to perform all or a portion of one or more operations described herein, such as the method 500 of FIG. 5.

It should be appreciated that one or more operations described herein as being performed by the controller 130 may be performed at the memory 104, and vice versa. As an illustrative example, "in-memory" ECC operations may be performed at the memory die 103, alternatively or in addition to performing such operations at the controller 130.

The data storage device 102 may be attached to or embedded within one or more host devices, such as within a housing of a host communication device (e.g., the host device 154), by a reflow operation or process (e.g., an IR reflow soldering process). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 154.

To further illustrate, the data storage device 102 may be configured to be coupled to the host device 154 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC (embedded MultiMedia Card) device. As another example, the host device 154 may be an enterprise device and the data storage device 102 may be configured to be removably coupled to the host device 154 (e.g., in accordance with a blade or modular storage architecture). To illustrate, the data storage device 102 may be part of an enterprise storage server or service, a network-accessible cloud storage server or service, etc.

As yet another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a Compact-Flash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) or two-dimensional (2D) memory, a flash memory (e.g., a NAND memory or a NOR memory) a single-level cell (SLC) memory, a multi-level cell (MLC) memory, a divided bit-line NOR (DINOR) memory, an AND memory, a high capacitive coupling ratio (HiCR) device, an asymmetrical contactless transistor (ACT) device, an erasable programmable read-only memory (EPROM), an electrically-erasable programmable read-only memory (EEPROM), a read-only memory (ROM), a one-time programmable memory (OTP), a resistive random access memory (ReRAM), or any combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
   responsive to initialization at a data storage device that includes a memory:
      reading a flag stored at the data storage device;
      determining that the flag has a first value indicating that a reflow operation has not previously been detected at the memory;
      in response to determining that the flag has the first value, performing reflow detection at the memory; and
      in response to the reflow detection indicating that the reflow operation has occurred, identifying a first word line of the memory that was in an unprogrammed state when the reflow operation occurred and setting the flag to a second value.

2. The method of claim 1, wherein the reflow operation comprises an infrared (IR) reflow operation.

3. The method of claim 1, further comprising, responsive to a second initialization at the data storage device, refraining from performing the reflow detection based on the flag having the second value.

4. The method of claim 3, wherein the first word line is in a block of the memory that includes another word line storing MLC data when the reflow operation occurred, and further comprising storing tagging data at the data storage device, the tagging data indicating that the first word line is restricted from storing multi-level cell (MLC) data.

5. The method of claim 4, further comprising, during a write operation at the memory:
   receiving particular data for MLC storage at the memory; and
   based at least in part on the tagging data, selecting a second word line instead of the first word line to store the particular data.

6. The method of claim 4, further comprising, during a write operation at the memory:
   receiving particular data for single-level cell (SLC) storage at the memory; and
   based at least in part on the tagging data, selecting the first word line to store the particular data.

7. The method of claim 1, wherein performing the reflow detection comprises:
   determining an error metric associated with at least a portion of the memory; and
   determining whether the error metric satisfies a threshold.

8. The method of claim 7, wherein the error metric comprises a failure bit count.

9. The method of claim 7, wherein the threshold is between a pre-reflow value of the error metric and a post-reflow value of the error metric.

10. The method of claim 7, wherein the error metric is determined based on a read voltage level used during a read operation at the memory.

11. The method of claim 10, wherein the read voltage level is a default read voltage level associated with the memory.

12. The method of claim 10, wherein the read voltage level is between a pre-reflow read voltage level and a post-reflow read voltage level.

13. The method of claim 10, wherein the read voltage level is determined based on one or more characteristics of the data storage device.

14. The method of claim 1, wherein the memory has a three-dimensional (3D) memory configuration, wherein the 3D memory configuration is monolithically formed in one or more physical levels of arrays of memory cells having an active area above a silicon substrate, and wherein the data storage device further includes circuitry associated with operation of the memory cells.

15. A data storage device comprising:
a controller; and
a memory coupled to the controller, wherein the memory is configured,
responsive to a power-up event, to:
determine, based on a flag stored at the memory having a first value, that a reflow operation has not previously been detected at the memory;
perform reflow detection at the memory; and
in response to the reflow detection indicating that the reflow operation has occurred, set the flag to a second value and store data at the memory to identify at least one word line of at least one open block of the memory, the at least one word line in an unprogrammed state when the reflow operation occurred and the at least one open block further including a second word line storing multi-level cell (MLC) data when the reflow operation occurred.

16. The data storage device of claim 15, wherein the memory is configured, responsive to a second power-up event, to refrain from performing the reflow detection in response to determining that the flag has the second value.

17. The data storage device of claim 16, wherein performing the reflow detection comprises determining an error metric and comparing the error metric to a threshold stored at the data storage device.

18. The data storage device of claim 15, wherein the memory has a three-dimensional (3D) memory configuration.

19. The data storage device of claim 18, wherein the 3D memory configuration is monolithically formed in one or more physical levels of arrays of memory cells having an active area above a silicon substrate, and wherein the data storage device further includes circuitry associated with operation of the memory cells.

20. A device comprising:
means for storing data; and
means, responsive to initialization at the means for storing and to a flag having a first value, for detecting whether a reflow operation has occurred at the means for storing, wherein the first value of the flag indicates that the reflow operation has not previously been detected at the means for storing,
the means for detecting configured, responsive to detecting that the reflow operation has occurred, to identify a first word line of the means for storing that was in an unprogrammed state when the reflow operation occurred and to set the flag to a second value.

* * * * *